United States Patent [19]

Murakami et al.

[11] Patent Number: 4,796,082
[45] Date of Patent: Jan. 3, 1989

[54] THERMALLY STABLE OHMIC CONTACT FOR GALLIUM-ARSENIDE

[75] Inventors: Masanori Murakami, Goldens Bridge; William H. Price, E. Rockaway, both of N.Y.

[73] Assignee: International Business Machines Corporation, Armonk, N.Y.

[21] Appl. No.: 26,337

[22] Filed: Mar. 16, 1987

[51] Int. Cl.$^4$ .................... H01L 29/161; H01L 23/48
[52] U.S. Cl. ........................................ 357/71; 357/16; 357/67; 437/184; 437/190; 437/192
[58] Field of Search .............................. 357/67, 71, 16; 437/184, 192, 190

[56] References Cited

U.S. PATENT DOCUMENTS

| | | | |
|---|---|---|---|
| 3,588,636 | 6/1971 | Giesfeldt | 357/67 |
| 3,717,798 | 2/1973 | Kahn | 357/67 |
| 3,768,151 | 10/1973 | Marinace | 357/67 |
| 3,929,525 | 12/1975 | Hawrylo | 357/65 |
| 4,188,710 | 2/1980 | Davey et al. | 357/67 |
| 4,263,605 | 4/1981 | Christou et al. | 357/67 |
| 4,316,201 | 2/1982 | Christou et al. | 357/15 |
| 4,325,181 | 4/1984 | Yoder | 437/184 |
| 4,395,727 | 7/1983 | Lauterbach | 357/71 |

OTHER PUBLICATIONS

*Appl. Phys. Lett.* vol. 46, No. 12, Jun. 15, 1985 "Uniform . . . Contacts to GaAs" by Murakam et al. pp. 1141-1143.
*J. Appl. Phys.* vol. 58, No. 7, Oct. 1, 1985 "In/Pt . . . GaAs" by Marvin et al. pp. 2659-2661.
Proceeding of Material Research Conference, 1985, Dec. "Non-Alloyed Ohmic Contacts to n-GaAs Using EPI Ge Layers" Sawada et al.
*Appl. Phys. Lett.* vol. 47, No. 4, Aug. 15, 1985, pp. 410-412. "Simultaneous . . . Semiconductors" by Shealy et al.
Journal of the Electrochemical Society, vol. 116, No. 5, May 1969 "Contact . . . GaAs" by Matino et al. pp. 710-711.
*Solid State Elec.* vol. 30, No. 12 pp. 1345-1349, 1987 "Ohmic Contacts . . . AuGe and Au." by Kamada et al.
*Appl. Phys. Lett.* vol. 51, No. 9, Aug. 31, 1987. pp. 664-666 "Thermally Stable . . . GaAs" By Masanori Murakami et al.
*J. Vac. Sci. Technol.* vol. 17, No. 4, Jul. Aug, 1980. pp. 776-792 "Refractor Silicides For Integrated Circuits" By Murarka.
IEDM 83 "Ohmic . . . Overlayers" by Tiwari et al. pp. 115-119.
*J. Appl. Phys.* vol. 56, No. 6, Sep. 15, 1984, pp. 1888-1889 "Therole . . . GaAs" By Lakhani.
*Solid State Elec.* vol. 22, 1979 pp. 141-149. "Solid Phase . . . Contact Systems" By Christou.
*IEEE Transactions on Elec. Dev.* vol. 22, No. 12, Dec. 1975, pp. 1073-1076 "Thin Phase . . . Contacts" By Sebestyen et al.

*Primary Examiner*—Martin H. Edlow
*Assistant Examiner*—Donald J. Featherstone
*Attorney, Agent, or Firm*—Perman & Green

[57] ABSTRACT

A thermally stable low resistance ohmic contact to gallium arsenide is fabricated using a layer of refractory material, and a layer of indium and a metal which forms thermally stable intermetallic compounds or single solid phase with indium. In forming the contact, a layer of indium is sandwiched between two layers of nickel, the sandwiched array of layers sitting on the substrate with the refractory tungsten layer on top to form a stratified structure. The stratified structure is heated to form nickel and indium intermetallic compounds and InGaAs layer at the metal/semiconductor interface. A thin layer of nickel between the indium and the gallium arsenide tends to form intermetallic compounds and limit a rate of diffusion of the indium into the gallium arsenide during heating so as to form a uniform fine distribution of InGaAs layer at the metal/gallium arsenide interface which results in low contact resistance. A contact resistance of 0.3 ohm-millimeters is obtained at elevated temperature in the range of 700°-1200° C. The resistance is stable after annealing at 400° C. for 100 hours.

10 Claims, 2 Drawing Sheets

THERMALLY STABLE OHMIC CONTACT FOR GALLIUM-ARSENIDE

BACKGROUND OF THE INVENTION

This invention relates to the fabrication of gallium-arsenide semiconductor devices having low resistance contacts and, more particularly, to the construction of a thermally-stable contact containing a small amount of indium to yield a low resistance path to electric current, the contract including an additional element for forming thermally stable intermetallic compounds with indium and/or a single solid phase.

Devices fabricated of semiconductor material frequently employ low-restance contacts to provide an electrically conducting path between the semiconductor material and electric circuits external to the devices. A field-effect transistor (F.E.T.) is a common example of a semiconductor device having low-resistance contacts. The low-resistance contacts are of the form known as ohmic contacts and are used in the formation of the source and the drain terminals of the transistor. The low-resistance contact forms a path to the semoconductor device, and allows electrical current to flow into or out of the semiconductor material without significant voltage drop.

A semiconductor material of particular interest herein is gallium arsenide (GaAs). Low resistance contacts to GaAs are essential for the fabrication of many high performance optical, microwave and logic devices. A commonly used low-resistance contact to n-type GaAs is composed of an alloyed gold-nickel-germanium (Au-Ni-Ge) system which produces contact resistance in the range of 0.2-1.0 ohm-millimeters. Other materials frequently used in the construction of non-ohmic (Schottky) contacts of GaAs are tungsten silicide and layers of gold, titanium, and platinum.

In the manufacture and packaging of a semiconductor device, such as the foregoing FET, after formation of low-resistance contacts and non-ohmic (Schottky) gates, the devices are required to withstand an elevated temperature, typically 400° Centigrade, for periods of a few minutes to several hours. Such heating over a sustained interval of time increases the resistance. For example, the resistance of a contact of Au-Ni-Ge has been observed to increase by a factor of three during annealing of the contact for five hours at 400° C.

In the construction of a low-resistance contact, the resistance is optimized by appropriate selection of material composition and by the cleaning of the substrate prior to the deposition of the material used in the low-resistance contact. While presently available techniques may be employed to provide low-resistance contacts with acceptably low values of resistance, the above-noted problem of increase in resistance with prolonged heating limits the application of currently used low-resistance contacts.

SUMMARY OF THE INVENTION

The foregoing problem is overcome and other advantages are provided by the construction of a low-resistance contact for a gallium-arsenide semiconductor device, such as a MESFET (metal semiconductor field-effect transistor) wherein metal is placed in contact with semiconductor material at a source or drain terminal of the transistor. In accordance with the invention, the low resistance contact comprises a small amount of indium, a conductive metal which forms high melting point intermetallic compounds and/or single solid phase with indium, the refractory material, and the gallium arsenide.

The contact structure of the invention provides low contact resistance and good thermal stability in the sense that the contact can be thermally cycled between room temperature and 400° C. repetitively, or held at an elevated temperature of approximately 400° C. without introducing any significant change in the contact resistance. The low contact resistance is due to formation of low barrier height (energy difference between the conduction band and the Fermi energy level) InGaAs phases at the metal/GaAs interfaces. The thermal stability is believed to be due to formation of intermetallic compounds with indium and use of refractory material, such as tungsten, on the top of the contact.

A further feature of the invention is found in the construction of the contact so as to insure a uniform distribution of the InGaAs phases without the formation of islands of indium at the interface. The uniformity in distribution is advantageous because it provides lower contact resistance with greater uniformity of the many contacts which are formed over the wafer and excellent run-to-run reproducibility of a manufacturing process. This uniformity is attained by placing a layer of a metal such as nickel between the indium and the gallium arsenide during fabrication of the contact. Indium tends to diffuse rapidly into gallium arsenide when deposited directly on the GaAs substrate. The layer of nickel tends to react with indium forming intermetallic compounds and/or a single solid phase with high melting points during a heating process, and provides desired uniformly-distributed indium-nickel compounds and InGaAs phases at the interface. The nickel has been found most effective in regulating the flow of the indium to the GaAs substrate. In addition to regulating the rate of diffusion of the indium, the iayer of nickel also improves adhesion and wetting between the contact metal and the gallium arsenide.

A further feature of the invention is the capacity for the nickel to reduce the contact resistance by forming a uniform low barrier height InGaAs layer between the nickel-indium compounds and the GaAs substrates. In a preferred embodiment of the invention, the contact is constructed by enclosing a layer of indium, or a layer of a mixture of indium and nickel, between upper and lower layers of nickel in the form of a sandwich, the sandwich structure being placed between the gallium arsenide and a layer of conductive refractory material such as tungsten. In the construction of the contact, the temperature of the materials is raised sufficiently to induce interaction between the indium and the nickel.

BRIEF DESCRIPTION OF THE DRAWING

The foregoing aspects and other features of the invention are explained in the following description, taken in connection with the accompanying drawings wherein.

DETAILED DESCRIPTION

Figure 1:
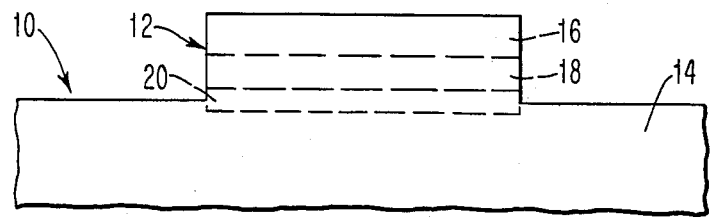
FIG. 1 is an enlarged side view, indicated partially diagrammatically, of a thermally stable, low-resistance contact formed in accordance with the invention.

FIG. 1 shows a portion of a semiconductor device 10 which may be a transistor, diode, or other type of component. The device 10 has a contact 12 disposed on a substrate 14 of semiconductor material to provide electrical connection to the device 10. By way of example, the contact 12 may be employed to provide electrical connection with a source or drain region of a field-effect transistor. In the preferred embodiment of the invention, the semiconductor material of the substrate 14 is gallium arsenide. Alternatively, the substrate may comprise indium-gallium arsenide or aluminum gallium arsenide.

In the construction of the contact 12, usually it is desired to minimize the resistance in a connection of the device 10 to an external circuit (not shown). Therefore, in the construction of the contact 12 of the preferred embodiment, the invention is directed to the construction which reduces the contact resistance to a low value, less than appproximately 0.5 ohm-millimeter.

In accordance with a major feature of the invention, the contact 12 is provided with the property of being thermally stable so as to retain the value of resistance at both normal environmental temperatures as well as at elevated temperatures, approximately 400° C. This is accomplished by constructing the contact 12 of a layer 16 of refractory material that is electrically conductive, and by dispersing thermally stable indium-nickel compounds or single solid phase in a region 18, and an InGaAs layer at an interface 20 between the layer 18 and the semiconductor substrate 14.

Materials considered as refractory do not melt or sublime at elevated temperatures, at least up to approximately 800° C. The refractory material of choice in the preferred embodiment of the invention is tungsten (W), other suitable refractory materials being tungsten silicide, titanium and titanium nitride.

Figure 2:
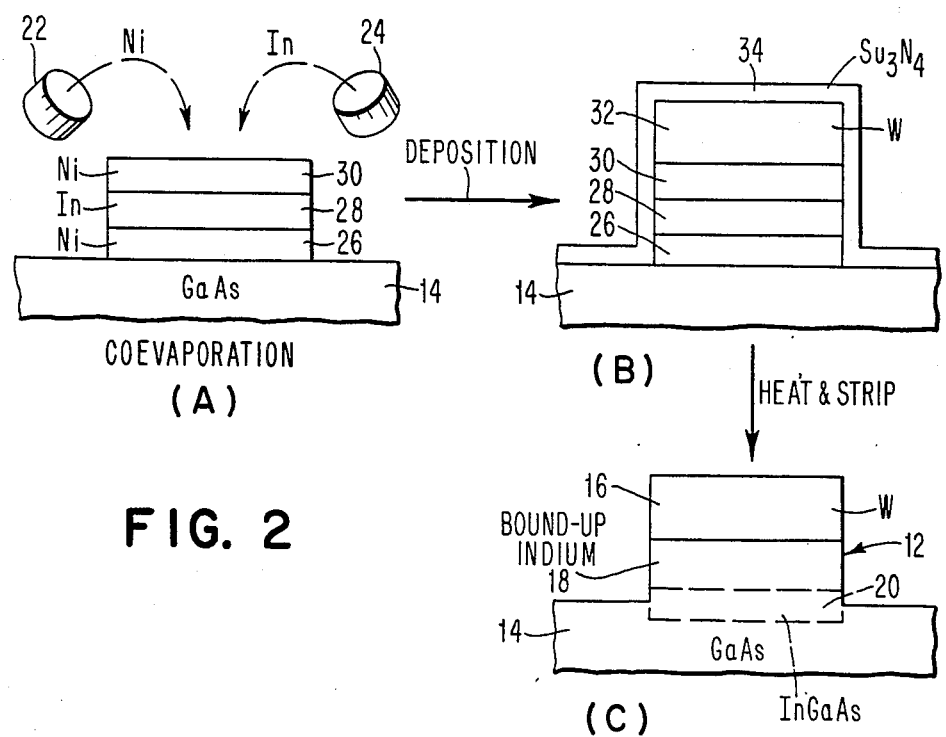
FIG. 2a-c show steps in a method of manufacture of the low-resistance contact of FIG. 1.

In FIG. 2, there is shown a process for the construction of the contact 12 for the device 10 of FIG. 1. The construction of the contact 12 begins with the deposition of layers of nickel (Ni) and indium (In) upon gallium arsenide (GaAs). The deposition is performed within an evaporation chamber (not shown) within a vacuum. The nickel and the indium are contained within separate crucibles 22 and 24, and are heated therein by conventional means, such as by an electron beam or by electrical resistance heating. Atoms of nickel and of indium evaporate from their respective crucibles 22 and 24 and become deposited upon the substrate 14.

In accordance with a feature of the invention, a layer 26 of nickel is first deposited upon the bulk semiconductor material of the substrate 14. Thereupon, indium or an indium-nickel mixture are evaporated and deposited as a layer 28 upon the layer 26. This is followed by the deposition of a further layer 30 of nickel upon the layer 28. The deposition of the nickel and indium are shown in step A of FIG. 2.

The construction of the contact 12 continues in step B of FIG. 2 wherein a layer 32 of refractory material such as tungsten is deposited by conventional means upon the layer 30. The structure of the four layers 26, 28, 30, and 32 is then sealed by coating the structure with a layer 34 of silicon nitride ($Si_3N_4$) to protect the structure and the underlying bulk gallium arsenide of the substrate 14 from contamination during a subsequent step of heating, and also to prevent out-diffusion of arsenic from the gallium arsenide of the substrate 14.

The construction of the ohmic contact 12 continues further with a heating the contact 12 to a sufficient temperature, a formation temperature in the range of 700°-1200° C. This formation temperature induces an interaction between the nickel and the indium with migration of indium atoms through the nickel layer 26 into the gallium arsenide of the material 14 to produce a uniform InGaAs layer at the interface 20. An environment of an argon-hydrogen mixture is useful to serve as a precaution against the possibility of impurities passing through any defects in the siliconnitride layer to insure purity of the contact 12 during heating. After ohmic contact formation, the coating layer 34 is removed as by a conventional etching process to complete construction of the contact 12 as shown at step C of FIG. 2. The contact 12 is now ready for receiving a metal conductor, such as gold or copper, for connection of the device 10 to the external circuit.

In the fabrication of the contact 12, the foregoing process accomplishes a feature of the invention in which a small amount of indium is allowed to interact with the gallium arsenide without a massive diffusion of the indium into the gallium arsenide. This results in the formation of the relatively thin layer of the aforementioned InGaAs at the interface 20. As is well known, at an elevated temperature of approximately 800° C., indium would tend to diffuse rapidly into the gallium arsenide. However, in accordance with the invention, such massive in-diffusion is limited by the nickel layer 26 to a relatively slow rate of diffusion which results in a highly uniform distribution of the indium atoms in the interface 20. The distribution of indium atoms can be repeated from run to run in a manufacturing process, thereby insuring uniformity in the characteristics of the contact 12 produced by the process of FIG. 2.

A further feature of the invention is accomplished by an interaction between the nickel and the indium at the relatively high temperature of formation of the contact 12, namely, the foregoing temperature range of 700° to 1200° C., to form intermetallic compounds of nickel and indium and/or a single solid phase of nickel and indium. The intermetallic compounds and the single solid phase have high melting points, resulting in improved thermal stability of the contact 12. Binding up of indium and nickel is a mechanism which further limits the diffusion of the indium through the layer 26 into the gallium arsenide, and, therefore, is an important feature of the invention in attaining the uniform distribution of the aforementioned InGaAs layer at the metal/GaAs interface 20. The combination of the action of the nickel layer 26 in acting as a barrier to the diffusion of indium, plus the binding up of excess indium in the layer 28 serve to regulate the diffusion of indium so as to prevent the formation of islands or globules of intense concentration of indium at the interface 20. It is believed that the formation of such islands or globules of intense concentrations of indium increase the contact resistance and may vary from run to run in a manufacturing process. As noted above, the regulation of the diffusion of the indium prevents the formation of the islands and insures the requisite uniform fine distribution of the InGaAs layer at the interface 20 to ensure the low contact resistance and the uniformity in the characteristics of the contact 12 from run to run of the manufacturing process.

In the construction of the stratified structure of the four layers 26, 28, 30 and 32, the total height of the structure is approximately 600 angstroms of which the following approximate thicknesses of the layers are employed in the preferred embodiment of the invention. Layer 26 is 50 angstroms thick; layer 28 is 100 angstroms thick and is composed of pure nickel or an In-Ni mixture; layer 30 is 100 angstroms thick; and layer 32 is 300 angstroms thick. With respect to the total amount of nickel and indium contained within the structure of the three layers 26, 28, and 30, there is approximately 90% nickel, by percent of atoms, and 10% of indium. A larger percentage of indium, up to 70%, may be employed. Intermetallic compounds of nickel and indium formed within the region 18 include $Ni_3In$, $NiIn$, $Ni_2In_3$, and $Ni_3In_7$. As may be observed from the foregoing compounds, they include different ratios of nickel and indium so as to insure that a bonding up of the indium can occur even in the presence of different local concentrations of indium and nickel atoms, which differences in concentration may occur naturally within the process of interdiffusion among the atoms of the respective layers 26, 28, and 30. The desired shape for the contact 12, as well as for other portions of the device 10, are formed by a photolithographic technique or a reactive-ion-etching technique, which techniques are well-known in the manufacture of semiconductor devices.

It is also noted, by way of alternative embodiment of the invention, that the layer 28 may be formed either solely of indium or a mixture of indium and nickel.

While nickel has been employed in the preferred embodiment of the invention in the layer 26 to serve as a barrier which limits the rate of diffusion of the indium into the gallium arsenide, it is believed that other metals such as palladium, titanium, manganese, and platinum can be deposited similarly in the layer 26 in lieu of the nickel to provide for regulation of the rate of indium diffusion into the semiconductor material of the substrate 14 by forming thermally stable intermetallic compounds with indium. With respect to the heating of the structure of the contact 12 to the contact formation temperature, it is noted that a flash heating may be employed as by use of an intense beam if infrared radiation for an interval of time at approximately 1-2 seconds. Such flash heating is well known, and equipment for accomplishing such flash heating is commercially available. The flash heating is advantageous because the relatively short interval of heating time aids in restricting the amount of diffusion of the indium into the gallium arsenide. It is further noted that the process of the invention is advantageous in that no complex equipment and their processes are required such as is associated with molecular beam epitaxy or molecular-organic chemical vapor deposition. It is also noted that the use of nickel in the layer 26 improves adhesion and wetting between the metal of the contact 12 and the galliumarsenide substrate 14.

Figure 3:
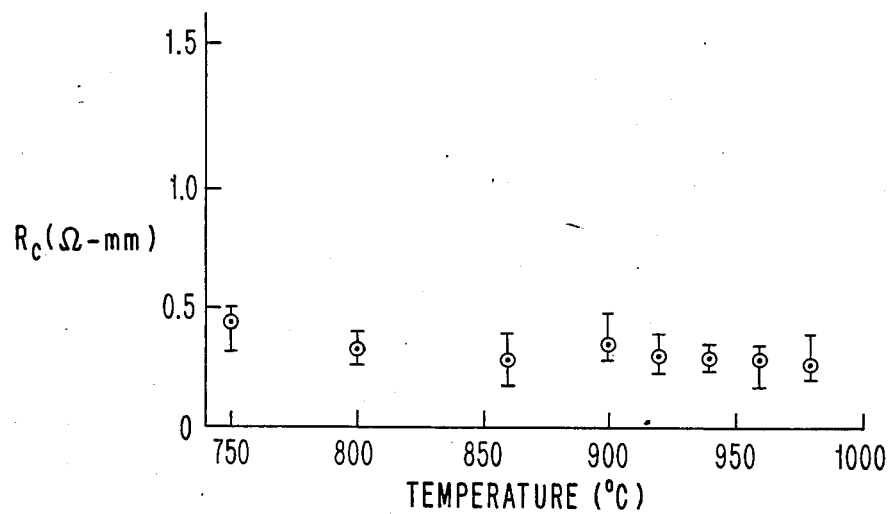
FIG. 3 is a graph of contact resistance versus formation temperature for the contact of FIG. 1.
Figure 4:
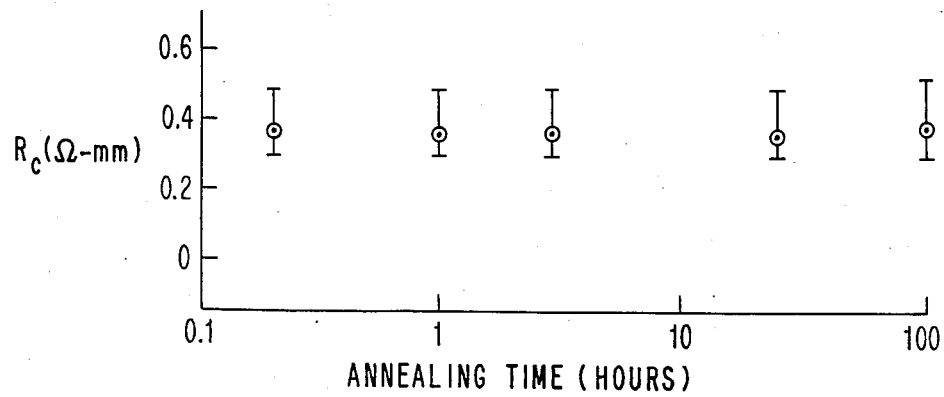
FIG. 4 is a graph showing stability of the contact resistance, at 400° C., of the contact of FIG. 1 with heating time.

The above noted intermetallic compounds of nickel and indium have melting points above 800° C. so as to insure thermal stability, such that variations in environmental temperature from room temperature to 400° C. should have essentially no effect on the stability of the contact resistance. The foregoing fabrication process has yielded an ohmic contact with a resistance of 0.3 ohms-millimeter. FIG. 3 shows values of resistance obtained experimentally as a function of temperature in the formation of the contact. FIG. 4 shows stability of the resistance at an elevated temperature of 400° C. as a function of time. The process of the invention also provides for a further convenience in the construction of a MESFET in which source and drain regions have been constructed with implanted silicon, which silicon is to be activated by raising the temperature above approximately 800° C.; such silicon implanting and activation can be accomplished simultaneously with the heating step in the process of FIG. 2.

A factor which facilitates use of the procedure of FIG. 2 is the fact that the indium melts at a temperature less than 800° C., which temperature is in the range of formation temperatures employed in the heating of the structure of the contact 12. In contrast, the resulting intermetallic compounds are solid at these temperatures. Therefore, non-refractory metals, nickel amd indium, are employed to produce material for the alloy region 18, which material may be regarded as refractory for the purpose of the invention.

Thermally stable ohmic contacts with low resistances are required generally for GaAs devices to yield the best performance. Reduction of contact resistance to n-type GaAs can be achieved by increasing donor density at the GaAs interface with the contact metal, and-/or by reducing the barrier height between the conduction band and the Fermi energy level of the metal contacting the GaAs. An increase in donor density is usually achieved by enhancing in-diffusion of donors from the metal to the GaAs by heating at elevated temperatures. Such donor doping techniques are extensively employed to prepare ohmic contacts such as AuNiGe. Reduction of the aforementioned barrier height can be accomplished by adding indium to GaAs resulting in the formulation of InGaAs or InAs at the foregoing interface.

Ohmic contacts employing indium at the interface and elevated temperatures in the manufacturing process are not necessarily low in resistance due to non-uniform distrbution of indium. In the absence of the practice of the invention for the regulation of indium diffusion into the gallium arsenide, as has been described above with reference to FIG. 2, the resulting ohmic contacts would be high in resistance. Such a contact has nonuniform distribution of InGaAs phases.

While thermal stability can be improved by using refractory materials in the construction of the contact, low contact resistances are difficult to obtain because of a lack of increase in donor density, during annealing procedures, as well as a difficulty in reducing the barrier height in the case of contacts employing refractory material. This limitation has been overcome in the practice of the invention.

It is interesting to note that, should an ohmic contact be fabricated of a relatively small amount of indium in refractory materials such as MoGeW, or GeW, relatively low contact resistances exhibiting thermal stability are attained due to the formation of InGaAs phases at the interface between contact metal and the GaAs. If indium were deposited directly on GaAs, the indium would diffuse deeply into the GaAs bulk material without formation of an InGaAs layer at the interface. If germanium were deposited between layers of indium and GaAS, the germanium layer acts as a barrier to diffusion of indium into the GaAs. However, since the germanium and the indium are not miscible, the indium diffuses into the GaAs through thinned regions of the germanium layer or grain boundaries resulting in the local formation of islands of InGaAs phases which yield high contact resistance and may introduce variations in the resulting contacts between successive runs of a manufacturing process.

The invention is able to overcome the foregoing limitations in the quality of ohmic contacts by forming a uniform InGaAs layer at the metal/GaAs interface and thermallly stable indium compounds on the top of this layer, thereby improving run-to-run reproducibilty of a manufacturing process.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

Having thus described our invention, what we claim as new, and desire to secure by Letters Patent is:

1. In a semiconductor device having a substrate of gallium and arsenic, a contact to the substrate comprising:
   a layer of conductive refractory material;
   a metallic layer of intermetallic compounds with indium, said layer being disposed between said layer of refractory material and said substrate; and wherein
   a layer of InGaAs is disposed between said metallic layer and said substrate.

2. A contact according to claim 1 wherein said substrate comprises a compound of gallium and arsenic from a set of compounds consisting of gallium arsenide, indium-gallium arsenide, and aluminum-gallium arsenide.

3. A contact according to claim 1 wherein said layer of conductive refractory material comprises a material from a set of refractory materials consisting of tungsten, tungsten-silicide, titanium-nitride and titanium.

4. A contact according to claim 1 wherein said metallic layer comprises a metal from a set of metals consisting of nickel, palladium, platinum, manganese and titanium.

5. A contact according to claim 4 wherein said metallic layer includes at least one intermetallic compound with said indium.

6. A contact according to claim 4 wherein metal of said metallic layer and said indium form a single solid phase.

7. In a semiconductor device comprising a substrate of gallium arsenide, a contact to said substrate formed by the process of:
   depositing a first layer of metal on said substrate, said metal forming an intermetallic compound with indium;
   depositing a second layer on said first layer, said second layer comprising indium;
   depositing a third layer of said metal upon said second layer;
   depositing a fourth layer of a refractory material on said third layer to prvide a stratified structure comprising said four layers supported by said substrate; and
   heating said stratified structure to a sufficient temperature to induce interaction of metal of said first and said third layers with said indium, said first layer limiting a rate of diffusion of said indium from said second layer through said first layer into the gallium arsenide of said substrate to form a uniform fine distribution of indium atoms within a layer of InGaAs along an interface between said first and said substrate resulting in low contact resistance and providing thermal stability to an electrical resisitance of said contact.

8. A contact according to claim 7 wherein said metal of said first layer and said third layer is drawn from a set of metals consisting of nickel, palladium, managanese, platinum, and titanium.

9. A contact according to claim 8 wherein said second layer comprises a metallic material drawn from the set of materials consisting of indium and a mixture of said metal and indium.

10. A contact according to claim 8 wherein said second layer comprises a mixture of said metal and indium.

* * * * *

UNITED STATES PATENT AND TRADEMARK OFFICE
CERTIFICATE OF CORRECTION

PATENT NO. : 4,796,082

DATED : January 3, 1989

INVENTOR(S) : Murakami et al

It is certified that error appears in the above—identified patent and that said Letters Patent is hereby corrected as shown below:

Column 8, line 18, "prvide" should be --provide--.

Column 8, line 28, the word --layer-- should appear after "first".

Signed and Sealed this

Thirtieth Day of May, 1989

Attest:

DONALD J. QUIGG

*Attesting Officer*   *Commissioner of Patents and Trademarks*